United States Patent [19]

Kano et al.

[11] 4,194,213

[45] Mar. 18, 1980

[54] SEMICONDUCTOR IMAGE SENSOR HAVING CCD SHIFT REGISTER

[75] Inventors: Yasuo Kano, Tokyo; Shunsuke Furukawa, Ebina; Tadayoshi Mifune, Yokohama, all of Japan

[73] Assignee: Sony Corporation, Tokyo, Japan

[21] Appl. No.: 825,706

[22] Filed: Aug. 18, 1977

Related U.S. Application Data

[63] Continuation of Ser. No. 645,029, Dec. 29, 1975, abandoned.

[30] Foreign Application Priority Data

Dec. 25, 1974 [JP] Japan ................................. 49-3860

[51] Int. Cl.² .................. H01L 29/78; H01L 27/14; H01L 31/00; G11C 19/28
[52] U.S. Cl. ...................................... 357/24; 357/30; 357/59; 307/221 D; 307/311
[58] Field of Search .............. 357/24, 30; 250/211 J; 307/221 D, 311

[56] References Cited

U.S. PATENT DOCUMENTS

| | | | |
|---|---|---|---|
| 3,863,065 | 1/1975 | Kosonocky et al. | 357/24 |
| 3,866,067 | 2/1975 | Amelio | 357/24 |
| 3,896,474 | 7/1975 | Amelio et al. | 357/24 |
| 3,896,485 | 7/1975 | Early | 357/24 |
| 3,898,685 | 8/1975 | Engeler et al. | 357/24 |
| 3,911,467 | 10/1975 | Levine | 357/24 |
| 3,995,302 | 11/1976 | Amelio | 357/24 |

OTHER PUBLICATIONS

Sequin "Blooming Suppression in Charge Coupled Area Imaging Devices", Bell System Technical Journal, vol. 51 (10/72) pp. 1923-1926.
Amelio, "Physics and Applications of Charge-Coupled Devices", IEEE International Convention Tech. Papers (3/73) vol. 6, Paper 1/3, 6 pages.

*Primary Examiner*—Gene M. Munson
*Attorney, Agent, or Firm*—Lewis H. Eslinger; Alvin Sinderbrand

[57] ABSTRACT

In a semiconductor image sensor composed of a plurality of charge-coupled photo-sensor elements, each of said photo-sensor elements comprises a substrate of one conductivity type with an insulating layer thereon, a first electrode on the insulating layer having a first electrode portion spaced from the substrate by a thickness of said insulating layer for defining, in combination with a potential applied to the first electrode, a first region in the substrate which is a potential well for minority charge carriers therein, a second electrode in the insulating layer having second and third electrode portions which are respectively adjacent to and remote from the first electrode, and which are spaced from the substrate by different thicknesses of the insulating layer for defining, in combination with a potential applied to the second electrode, adjacent second and third regions in the substrate which are respectively a potential barrier to the potential well in the first region and a potential well for the minority charge carriers relative to the potential barrier of the second region, and a third electrode in the insulating layer spaced from the substrate and second electrode by the insulating layer and having a fourth electrode portion overlapping the third electrode portion, with at least one of the second and third electrodes having a cutout portion cooperating with an adjacent portion of the other of such electrodes to define an opening above the aforementioned first region which is a potential well.

5 Claims, 18 Drawing Figures

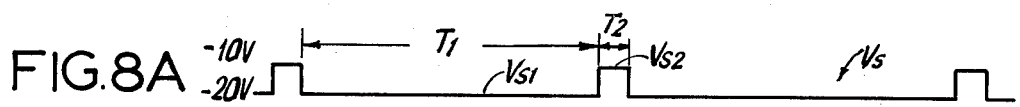
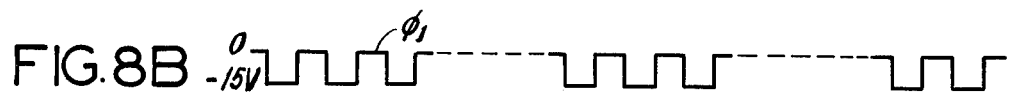
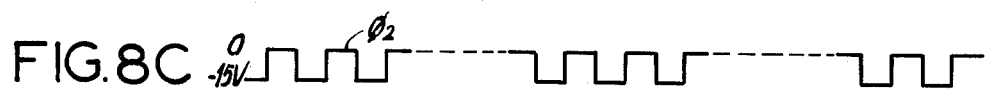
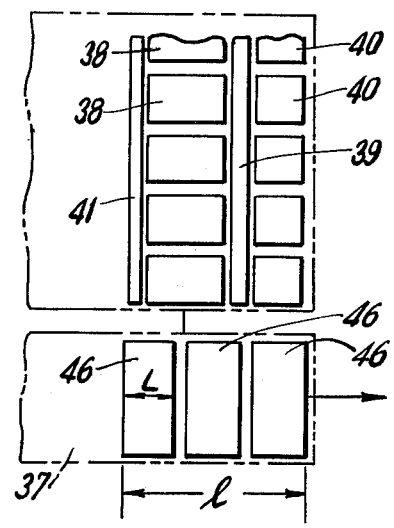
FIG.9
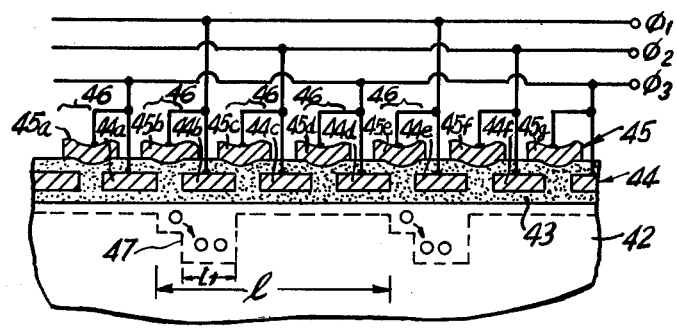
FIG.10

SEMICONDUCTOR IMAGE SENSOR HAVING CCD SHIFT REGISTER

This is a continuation of application Ser. No. 645,029, filed Dec. 29, 1975 now abandoned.

BACKGROUND OF THE INVENTION

1. Field of the Invention

This invention relates to semiconductor image sensors having charge-coupled devices (CCD) operating as electro-optic transducers and charge-transfer devices as a self-scanning matrix structure.

2. The Prior Art

There are existing image sensors constructed on the surface of a semiconductor divided into elements arranged horizontal rows and vertical columns. Each element includes a semiconductor photo-sensor and a charge-transfer device connected thereto to connect all of the photo-sensor elements of a vertical column to a vertical shift register. One end of each of the vertical shift registers is connected to the horizontal shift register located on the same semiconductor substrate.

The vertical shift registers are operated in unison to transfer charge carriers from position to position along the vertical shift registers so that they eventually reach the horizontal shift register. The carriers reach the horizontal shift register at the equivalent of one horizontal line of the video image at a time, and they are transferred along the horizontal shift register at a rate equivalent to the horizontal scanning speed of a television system. At the output of the horizontal shift register, the carriers are applied to a utilization circuit.

The conventional elements of an image sensor according to the prior art include an insulating layer on the semiconductor substrate and a transparent electrode on the insulating layer. One part of each element is arranged so that the transparent electrode is spaced from the substrate only by the insulating layer so that photons that reach the transparent electrode can produce minority charge carriers in the region of the substrate directly behind that part of the transparent electrode. The elemental area also includes one electrode of the vertical shift register to which that element is connected. Part of the electrode is separated from the semiconductor substrate by the insulating layer, and between that part and the part of the transparent electrode that is also separated from the substrate only by the insulating layer is a transfer electrode. The transfer electrode is also separated from the semiconductor substrate by the insulating layer, and a part of the shift register electrode overlaps the transfer electrode but is insulated therefrom by additional insulating material. The transparent electrode also extends over the transfer electrode and the shift register electrode but is separated from each of them by more of the insulating material of the insulating layer. An opaque layer overlies the transfer electrode and the shift register electrode, leaving substantially only the area to be illuminated uncoated.

The vertical shift registers of the prior art are operated as two-phase devices, which are clocked at the horizontal repetition rate. The transparent electrode has a fixed voltage applied to it and the transfer electrode is pulsed at field repetition rate so that during one field interval, charge carriers from those elements lying in odd horizontal lines will be transferred to their respective vertical shift registers, and during the remaining alternate field intervals, those elements lying in even horizontal lines will transfer their carriers to their respective vertical shift registers.

The prior art structure requires three types of electrodes, one to receive the proper potential to operate the photo-sensors, another to receive the clock pulses, and a third to transfer charge carriers from the photo-sensor regions to regions controlled by the electrodes operated by the clock pulses.

OBJECTS AND SUMMARY OF THE INVENTION

This invention relates generally to charge-coupled photo-sensor elements, that is, charge-coupled devices (CCD) operating as electro-optic transducers, and to semi-conductor image sensors composed of a plurality of such charge-coupled photo-sensor elements.

Generally, the object of this invention is to provide charge-coupled photo-sensor elements capable of being arranged in vertical columns and horizontal rows to form a semi-conductor image sensor without the necessity of providing transfer electrodes and the voltage heretofore required for application to such transfer electrodes.

A charge-coupled photo-sensor element for a semiconductor image sensor according to this invention comprises a substrate of one conductivity type with an insulating layer thereon, a first electrode on said insulating layer having a first electrode portion which is spaced from said substrate by a thickness of said insulating layer for defining, in combination with a potential applied to said first electrode, a first region in said substrate which is a potential well for minority charge carriers in said substrate, a second electrode in said insulating layer having a second electrode portion adjacent one side of said first electrode and an adjacent third electrode portion remote from said first electrode, said second electrode portion being spaced from said substrate by a thickness of said insulating layer which is greater than the thickness of said insulating layer which spaces said third electrode portion from said substrate defining, in combination with a potential applied to said second electrode, a second region in said substrate adjacent said first region which is a potential barrier for said minority charge carriers in said substrate relative to said potential well in said first region, and for defining with said third electrode portion in combination with the potential applied to said second electrode, a third region in said substrate adjacent said second region and which is a potential well for said minority charge carriers in said substrate relative to said potential barrier in said second region, and a third electrode in said insulating layer extending generally parallel to said second electrode and electrically insulated from the latter by said insulating layer, said third electrode being connected to receive the same potential as the second electrode, said third electrode having a fourth electrode portion overlapping said third electrode portion and being spaced from said substrate by a thickness of said insulating layer which is larger than said thickness of the insulating layer which spaces said third electrode portion from said substrate, at least one of said second and third electrodes having a cutout portion cooperating with an adjacent portion of the other of said second and third electrodes to define an opening above said first region.

In accordance with a feature of this invention, the first electrode may further include a connecting portion extending from the side of said first electrode to which said second electrode portion of said second electrode is adjacent over said second electrode for connection to a first electrode portion of a first electrode of another of the photo-sensor elements, with the insulating layer spacing said connecting portion of said first electrode from said second electrode.

It is another feature of this invention to make at least said first electrode portion of said first electrode and said insulating layer transparent for permitting the illuminating therethrough of said first region in said substrate to produce said minority charge carriers.

BRIEF DESCRIPTION OF THE DRAWINGS

FIGS. 8A–8C are waveform of voltage pulses applied to operate the device in FIGS. 3-6.

FIG. 9 is a plan view of another fragment of a semiconductor image sensor according to the invention.

FIG. 10 is a cross-sectional view of a fragment of the device in FIG. 9 along the line 10—10.

DETAILED DESCRIPTION OF THE PRIOR ART

Figure 1:
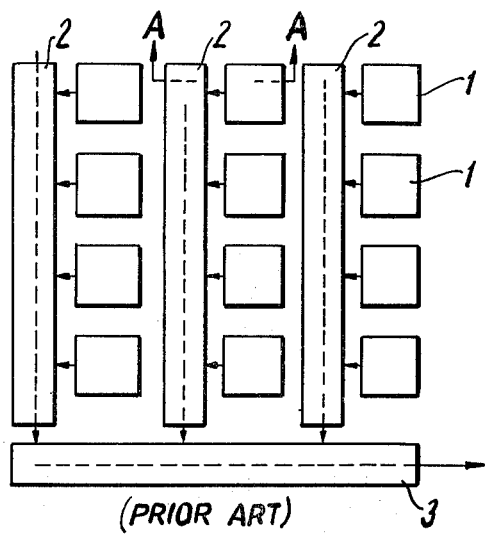
FIG. 1 is a schematic representation of a conventional semiconductor image sensor employing an interline transfer operation.

The semiconductor images sensor in FIG. 1 is constructed on the major surface of a semiconductor substrate (not shown) and includes a matrix of photo-sensor elements 1 arranged in vertical columns and horizontal rows. All of the photo-sensor elements 1 in a given vertical column are connected to the same vertical shift register 2, and one end of each of the vertical shift registers 2 is connected to a horizontal shift register 3, which is also located on the semiconductor substrate. Minority carriers generated in each of the photo-sensor elements 1 in alternate rows are simultaneously transferred to the vertical shift registers 2. The charges thus transferred are transported sequentially along the vertical shift registers 2 to the horizontal shift register 3 and are transferred from left to right along the shift register 3 to an output terminal connected to a utilization circuit. Then the minority carriers in the remaining alternate horizontal rows, which represent horizontal scanning lines of an interlaced scanning system, are transferred to the vertical shift registers 2 and along the vertical shift registers to the horizontal shift register 3. The rate of transfer of charge carriers along the shift register 3 corresponds to the scanning rate of a single horizontal line in a television system, and the rate of transfer of carriers along the vertical shift registers 2 corresponds to the vertical scanning speed of a television system.

Figure 2:
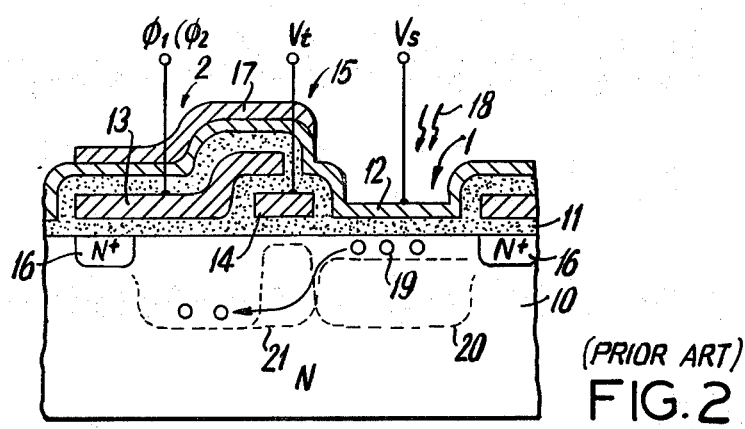
FIG. 2 is a cross-sectional view along the line 2—2 of a fragment of the sensor in FIG. 1.
Figure 3:
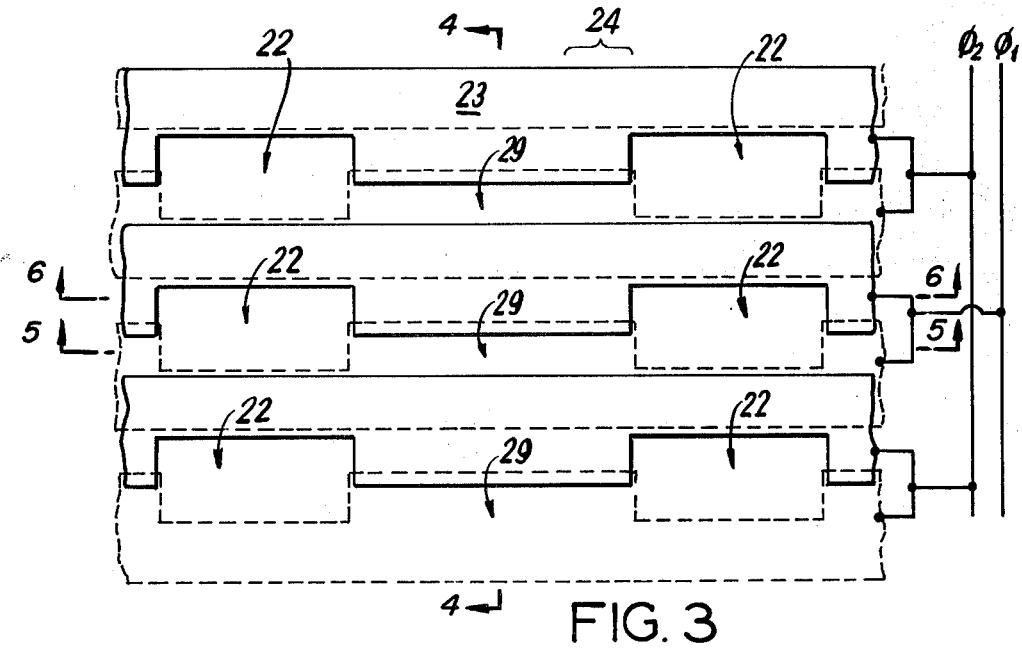
FIG. 3 is a plan view of a fragment of a semiconductor image sensor according to the present invention.

FIG. 2 is a cross-sectional view of one of the elements of the device in FIG. 1. The photo-sensor 1 is constructed on a major surface of a semiconductor substrate 10, which, in this embodiment, is an N-type substrate. An insulating layer 11 is formed on one surface of the substrate and in the region of the photo-sensor 1, a transparent electrode 12 is formed directly on the surface of the insulating layer 11. The vertical shift register 2 to which this particular photo-sensor element 1 is connected includes a shifting electrode 13, which is formed on another part of the insulating layer 11. Still another electrode 14, referred to as the transfer electrode, is formed on the layer 11 between the photo-sensor 1 and part of the shifting electrode 13. Another part of the shifting electrode 13 overlaps the transfer electrode 14 and is insulated therefrom by the same insulating material that makes up the layer 11. The transparent electrode 12 also overlaps the transfer electrode 14 and the shifting electrode 13, as well, but is insulated from both of them by more of the insulating material of the type in the layer 11. The portion of the structure shown in FIG. 2 that includes the transfer electrode 14 is identified as the transfer portion 15. Vertical edges of the columns are defined by channel stops 16 of N+ type conductivity and by an opaque light shield layer 17.

The operation of the element in FIG. 2 and of the sensor in FIG. 1 includes the application of a suitable fixed voltage $V_s$ to the transparent electrode 12. This voltage $V_s$ may be, for example, about $-20$ volts. Each of the vertical shift registers 2 in FIG. 1 includes a separate electrode 13 of the type shown in FIG. 2 for each of the elements 1. Alternate shifting electrodes 13 in the various vertical shift registers 2 have clock pulses $\phi_1$ at, for example, 0 volts applied to them, and the remaining alternate shift electrodes 13 have clock pulses $\phi_2$ at, for example, $-20$ volts applied to them. At the end of each horizontal line interval the pulses shift, and those electrodes to which the 0 volts was applied receive the $-20$ volts, and vice versa. A voltage $V_t$ of, for example, $-20$ volts is applied to the transfer electrodes 14 for a fixed interval that corresponds to one field interval.

When light is incident on the photo-sensors 1 in FIG. 1, a pattern of charges is produced. In the single element in FIG. 2, the incident light on the exposed part of the transparent electrode 12 having a suitable voltage $V_s$ applied to it causes minority carriers (holes) to be generated and to be stored at the immediately adjacent part of the semiconductor substrate 10 in a region thereof defined as having a potential well (with respect to holes). When the minority carriers are accumulated, the potential of the well rises according to charges on the holes stored in that well. As long as the transfer electrode has a voltage $V_t=0$ applied to it, the potential of the transferring portion 15 is high, and stored carriers in the photo-sensor 1 are not transferred to the shift register 2. On the other hand when the voltage $V_t=-20$ volts is applied to the transfer electrode 14, the potential of that portion of the semiconductor substrate 10 under the electrode 14 is lowered according to the dotted line 21, and minority carriers in the photo-sensor 1 are transferred to the shift register 2.

The vertical shift registers 2 in FIG. 1 operate according to a two-phase principle so that alternate electrodes 13 must not have charge carriers transferred to them by their respective photo-sensors 1. This permits the charges that are transferred to the remaining alternate electrodes 13 from their respective photo elements 1 to be transferred along the vertical shift registers 2 to the shift register 3. After transferring the charge carriers, the voltage $V_t$ on the transfer electrodes 14 returns to $V_t=0$, and the carriers that have been transferred to the vertical shift registers 2 can be transferred along these shift registers to the horizontal shift register 3.

One of the disadvantages of the electrode configuration in FIG. 2 is that three kinds of electrodes are required. In addition, the voltage of the transfer electrode 14 is influenced by the voltage of the shifting electrode 13 if the transfer electrode 14 is made of high resistivity poly-silicon.

DESCRIPTION OF THE PREFERRED EMBODIMENTS

The embodiment of the invention in FIGS. 3–6 will now be described. The semiconductor image sensor according to this invention has photo-sensor elements 10 arranged in a matrix 22 with a plurality of vertical CCD shift registers 23 separating the elements 22 into vertical columns. A transfer portion 24 is located between each of the elements 22 and its vertical shift register 23, and overflowing portions 25 defined by potential barriers in the substrate 21 also extend vertically along the element 22 to separate the columns of photo-sensor elements 22 and adjacent shift register elements 23. This embodiment of the invention also includes a horizontal CCD shift register (not shown) at the corresponding end of each of the vertical shift registers 23.

Figure 4:
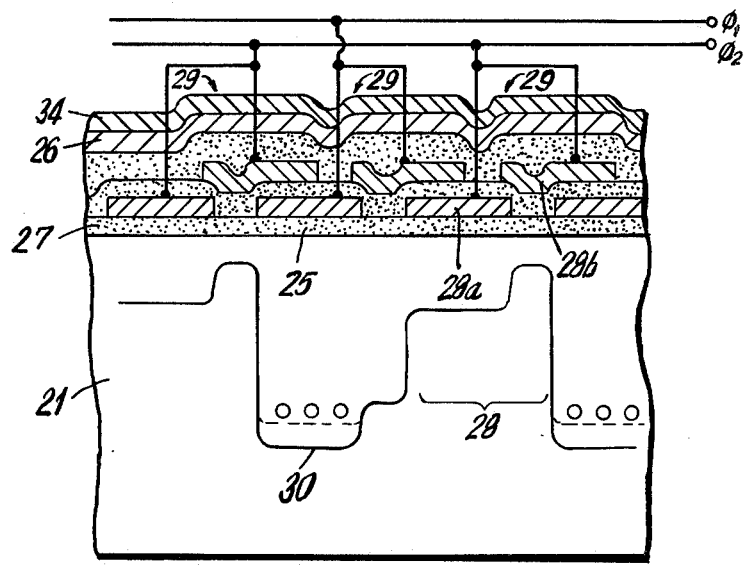
FIGS. 4–6 are cross-sectional views of a fragment of the device in FIG. 3 along the lines 4—4, 5—5, and 6—6, respectively, in FIG. 3.

Each photo-sensor 22 includes a first region portion of a transparent electrode 26 applied to the exposed surface of an insulating layer 27 on the surface of the semiconductor substrate 21. Shifting electrodes 28a and 28b are also applied to the insulating layer 27 but are separated from different portion of the surface of the substrate 21 by different thicknesses of the layer 27 to constitute vertical transfer devices 29. Clock pulses $\phi_1$ and $\phi_2$ are applied to alternate sets of shifting electrodes 28a and 28b. As shown particularly in FIG. 5, the shifting electrodes 28a are applied over thin portions of the insulating layer 27. As shown particularly in FIG. 6, the shifting electrodes 28b are applied over thicker portions of the insulating layer 27. Each of the shifting electrodes 28a and 28b has an edge or second region portion with a greater thickness of the layer 27 between it and the substrate 21 than the central or third region portion of that shifting electrode. As shown in FIG. 4, the application of clock pulse voltages of $\phi_1 = -15$ V and $\phi_2 = 0$ V to adjacent sets of electrodes 28a and 28b forms a stair-like potential well 30 within the substrate 21.

Figure 5:
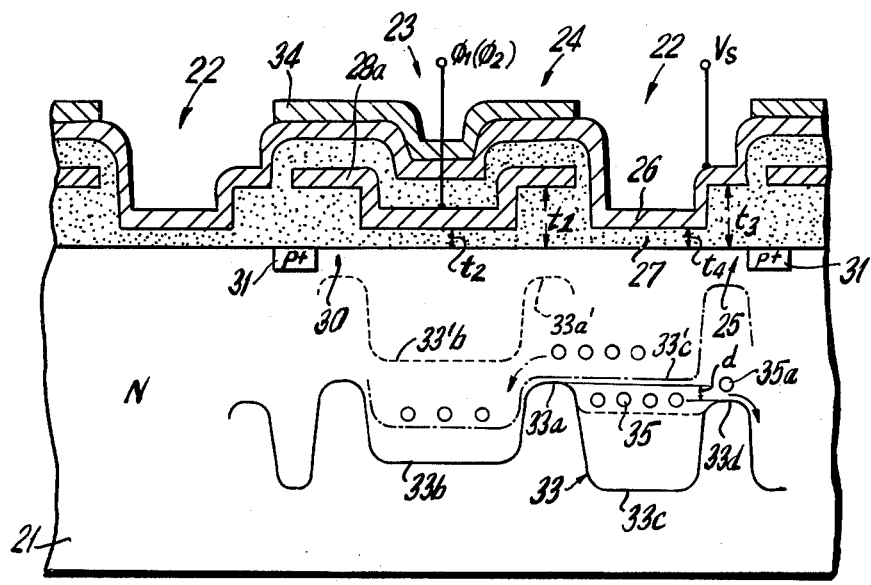
Figure 6:
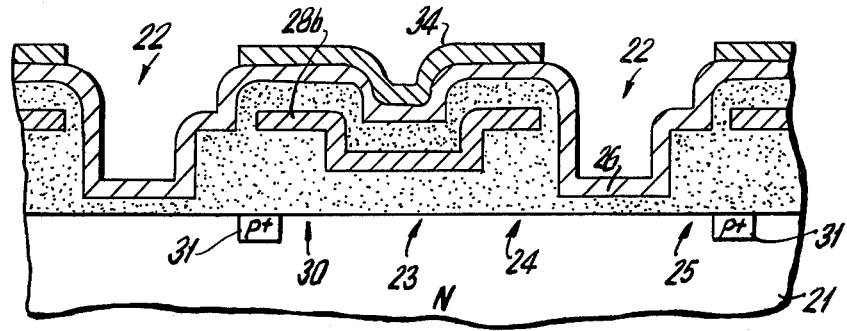

The transferring portion 24 includes an extended portion of the first shifting electrode 28a separated from the substrate 21 by a relatively thick portion of the insulating layer 27 located between the photo-sensor 22 and the shift register 23 for that photo-sensor. As shown in FIG. 5, the potential 33a of the transfer portion 24 is higher than the potential 33b due to the shift register electrode 28a. In this embodiment, the thickness $t_1$ of the insulating layer 27 under the transfer portion 24 of the electrode 28a is larger than the thickness $t_2$ of that portion of the layer 27 under the central part of the electrode 28a. The edge of this shifting electrode 28a away from transfer portion 24 also has a relatively thick portion of the insulating layer 27 between it and the substrate 21 to form a channel stopping region 30 in which the potential is relatively high to prevent the leakage of carriers from one vertical column to the next. A P+ region 31 extending vertically adjacent the region 30 also helps to isolate the vertical columns.

A voltage $V_{s1}$ is applied to the transparent electrode 26 to form a deep potential well 33c, as shown in FIG. 5, when carriers are to be stored. A voltage $V_{s2}$ is applied to produce a shallow potential 33c' which is higher than the potential 33b of the shift register 23, when the shifting electrode 28 has the lower (negative) level of the clock pulse applied to it. As a result, carriers stored in the photo-sensor 22 are transferred to the shift register 23. The potential 33c' of this part of the semiconductor substrate 21 is lower than the potential 33b' of the shift register 23 when the higher level of the clock pulse is applied to the electrode 28a of the shift register. The potential 33c in the potential well under the exposed part of the transparent electrode 26 is, of course, raised to some extent according to the quantity of stored charges 35.

The overflow portion 25 includes the opposite conductivity region 31 that extends vertically along the elements 22 on the substrate 21 and also includes a portion of the transparent electrode 26 on a thick section of the insulating layer 27 between the photo-sensor 22 and the region 31. The overflow portion 32 has a potential 33d that is higher than the potential 33c of the photo-sensor 22 when the voltage $V_{s1}$ is applied to the transparent electrode 26. The potential 33d is lower than the potential 33a of the transferring portion 24 when either the higher or the lower (more negative) level of the clock pulse is applied to the electrode 28a. Thus, when strong light is incident on the photo-sensor 22 so as to cause excessive voltage build-up due to the storage of an excessive number of carriers 35, the extra carriers 35a overflow to the region 31, to which a reverse bias is applied. Otherwise the surplus carriers, if they raised the potential 33c above the level of the barrier 33a, would flow into the shift register 23. The difference between the barriers 33a and 33d is indicated by a vertical measurement d. If surplus carriers flowed into the shift register 23, they would reduce the resolution of the image sensor.

In the embodiment shown in FIGS. 3–6, the thickness $t_3$ of the insulating layer 27 in the overflow portion 32 is greater than the thickness $t_4$ in the portion of the photo-sensor 22 that operates in storing minority carriers. If the thickness $t_1$ is equal to the thickness $t_3$ and if the thickness $t_2$ is equal to the thickness $t_4$, the voltage applied to the transparent electrode 26 is more negative than the lower (negative) level of the clock pulse ($\phi_1 = -15$ Volts) applied to the shifting electrode 28.

The transparent electrode 26 covers all of the insulating layer 27, but a light shield and conductive layer 34 covers most of the layer 26 except for the portion devoted to the photo-sensor 22.

FIG. 7 illustrates the method of manufacturing an image sensor of the type just described in connection with FIGS. 3–6. A silicon dioxide layer 27a having a thickness of about 0.4 micron is formed on a major surfae of the N type silicon substrate 21. The layer 27a is selectively etched, and P+ type regions 31 are diffused through the resulting windows 36 (FIG. 7A).

Figure 7A:
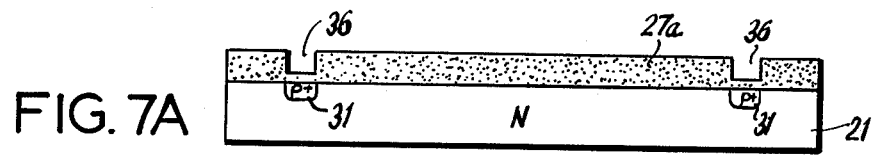
FIGS. 7A–7G are cross-sectional views of a semiconductor structure illustrating a succession of steps in the production of the device shown in FIGS. 3-6.
Figure 7B:
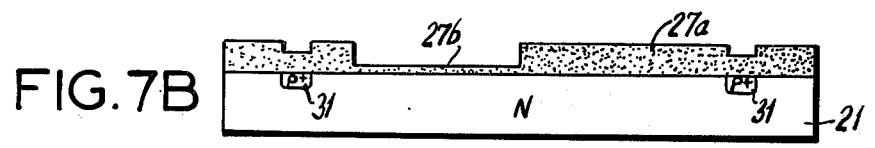

Thereafter the layer 27a is again selectively etched to form a silicon dioxide layer 27b having a thickness of 0.1 micron (FIG. 7B).

Figure 7C:
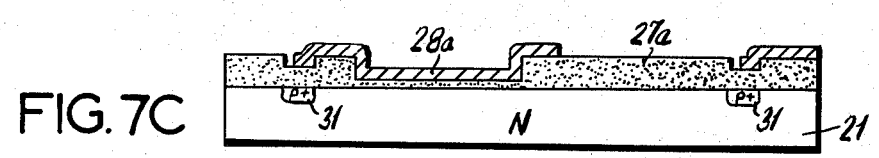

A first electrode 28a of doped poly-silicon is deposited on the portion 27b of the layer 27a and adjacent portions of the layer 27a. The electrode 28a also overlaps the adjacent channel stopping region 31 (FIG. 7C).

Figure 7D:

An additional silicon dioxide layer 27c having a thickness of about 0.3 micron is formed over the entire exposed surface (FIG. 7D). A second electrode 28b of doped poly-silicon (shown in FIG. 6) is selectively deposited on the layer 27c to be vertically in line with the electrode 28a.

Figure 7E:
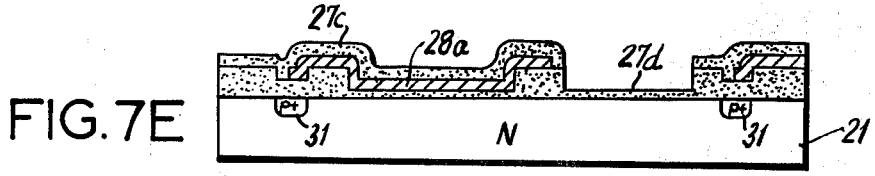

The layers 27a and 27c are selectively etched to form a thin silicon dioxide layer 27d having a thickness of about 0.1 micron in a region that will later become the photo-sensor 22 (FIG. 7E).

Figure 7F:
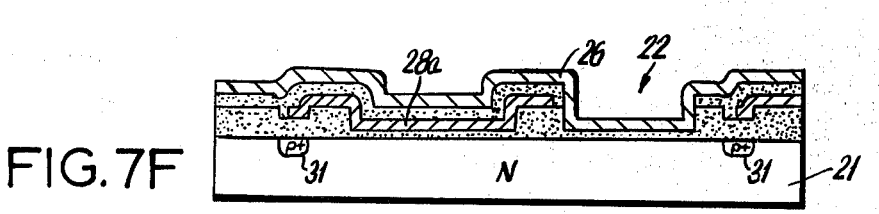

A transparent layer 26 of tin oxide or thin, doped polysilicon is deposited over the entire exposed surface of the device (FIG. 7F).

Figure 7G:
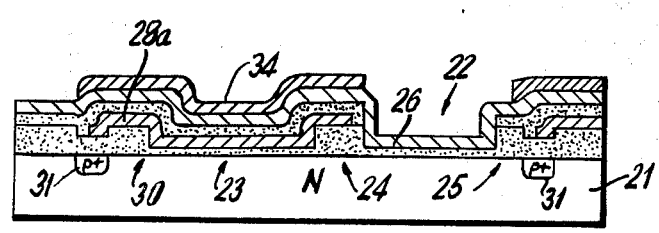

A light shield layer 34 of aluminum is deposited on portions of the layer 26 except those that are to be used as the photo-sensor 22 (FIG. 7G).

The voltage pulses used in the operation of the device in FIGS. 3-6 are shown in FIGS. 8A-8C. FIG. 8A represents the voltage $V_s$ applied to the transparent electrode 26. This voltage has a value of $-20$ volts corresponding to $V_{s1}$ during the interval $T_1$ corresponding to the visible part of a television field. The voltage $V_s$ has a value of $-10$ volts corresponding to $V_{s2}$ during an interval of $T_2$ that corresponds to the vertical blanking interval. FIGS. 8B and 8C show clock pulses $\phi_1$ and $\phi_2$, which are square wave pulses having a duty cycle twice the horizontal line scanning interval of the television system with the polarity of $\phi_2$ opposite to that of $\phi_1$. Both of the pulses $\phi_1$ and $\phi_2$ have a positive value of 0 volts and a negative value of $-15$ volts, and they are applied to alternate shifting electrodes of the vertical shift register to be operated as a two-phase CCD.

When the voltage $V_{s1}$ of FIG. 8A is applied to the transparent electrode 26, minority carriers are generated in the photo-sensors 22 according to the strength of the light incident thereon and are stored at the potential well 33c, which is shown particularly in FIG. 5. When the voltage $V_{s2}$ is applied and a clock pulse value of $-15$ volts is also applied to the shifting electrode 28a, the potential 33c' of the photo-sensor is made higher than the potential 33a of the transferring portion 24, and carriers are transferred to the shift register 23. On the other hand, if the 0 volt value of the clock pulse is applied to the shift register 23, the potential 33c' of the photo-sensor 22 is lower than the potential 33a' of the transfer portion 24, so that carriers are not transferred. Since the clock pulses $\phi_1$ and $\phi_2$ are applied in opposite polarity to adjacent sets of electrodes 28a and 28b, carriers are transferred from alternate photo-sensors 22 to their respective shift registers 23, and carriers are transferred at $2T_1$ intervals in each cell.

Carriers simultaneously transferred from each photo-sensor 22 to the corresponding vertical shift register 23 are sequentially transferred vertically by the clock pulses $\phi_1$ and $\phi_2$. Carriers from, for example, odd numbered fields are thus inserted into the horizontal CCD shift register at one line intervals and are transferred to an output circuit during each line interval. After transferring the carriers, which is equivalent to scanning the image optically produced on the semiconductor image sensor, in one field interval, the voltage $V_{s2}$ is applied to the transparent electrode 26, and carriers that correspond to even numbered fields are simultaneously transferred to the vertical shift registers and are sequentially read out by the horizontal shift register in the following field interval.

FIGS. 9 and 10 show an improved embodiment of a horizontal three-phase CCD shift register 37 according to the invention. This shift register has a first set of electrodes 44 made up of electrodes 44a, 44b, 44c, . . . and a second set of electrodes made up of electrodes 45a, 45b, 45c, . . . These electrodes are formed on the surface of the semiconductor according to the method of manufacture of vertical shift registers. Each pair of corresponding first and second electrodes 44 and 45 is connected to each other to constitute shifting electrodes 46. The length l of the three shifting electrodes 46 corresponds to the entire width of each basic element of the semiconductor image sensor, including a photo-sensor 40, a transferring portion 39, a vertical shift register 38, and a channel stopper 41. Three phase clock pulses $\phi_1$, $\phi_2$ and $\phi_3$ are applied to sets of three shifting electrodes 46. Each shifting electrode 46 to which the lowest level pulse is applied has a stairlike potential well 47 so that carriers are collected at the well under the first electrode 44. Consequently the effective length of the shifting electrode 46 is equal to the length $L_1$ of the first electrode 44 rather than to the length L of the shifting electrode 46. This raises the transfer speed and enables higher frequency driving clock pulses to be employed.

While this invention has been described in terms of specific embodiments, it will be apparent to those skilled in the art that modifications may be made therein within the true scope of the invention as defined by the following claims.

What is claimed is:

1. A charge-coupled photo-sensor element for a semiconductor image sensor, said photo-sensor element comprising:

a substrate of one conductivity type;

an insulating layer on said substrate;

a first electrode on said insulating layer having first means for applying a potential to said first electrode, said first electrode having a first electrode portion which is spaced from said substrate by a thickness of said insulating layer for defining, in combination with the potential applied to said first electrode by said first means, a first region in said substrate which is a potential well for minority charge carriers in said substrate;

a second electrode in said insulating layer having second means for applying a potential to said second electrode, said second electrode having a second electrode portion adjacent one side of said first electrode and an adjacent third electrode portion remote from said first electrode, said second electrode portion being spaced from said substrate by a thickness of said insulating layer which is greater than the thickness of said insulating layer which spaces said third electrode portion from said substrate for defining, in combination with the potential applied to said second electrode by said second means, a second region in said substrate adjacent said first region which is a potential barrier for said minority charge carriers in said substrate relative to said potential well in said first region, and for defining with said third electrode portion in combination with the potential applied to said second electrode by said second means a third region in said substrate adjacent said second region and which is a potential well for said minority charge carriers in said substrate relative to said potential barrier in said second region; and a third electrode in said insulating layer and extending generally parallel to said second electrode and electrically insulated from the latter by said insulating layer, said third electrode being connected with said second means for receiving a potential therefrom, said third electrode having a fourth electrode portion overlapping said third electrode portion and being spaced from said substrate by a thickness of said insulating layer which is larger than said thickness of the insulating layer which spaces said third electrode portion from said substrate, at least one of said second and third electrodes having a cutout portion cooperating with an adjacent portion of the other of said second and third electrodes to define an opening above said first region.

2. In a semiconductor image sensor composed of a plurality of charge-coupled photo-sensor elements, each of said photo-sensor elements comprising:
a substrate of one conductivity type;
an insulating layer on said substrate;
a first electrode on said insulating layer having, first means for applying a potential to said first electrode, said first electrode having a first electrode portion which is spaced from said substrate by a thickness of said insulating layer for defining, in combination with the potential applied to said first electrode by said first means, a first region in said substrate which is a potential well for minority charge carriers in said substrate;
a second electrode in said insulating layer having second means for applying a potential to said second electrode, said second electrode having a second electrode portion adjacent one side of said first electrode and an adjacent third electrode portion remote from said first electrode, said second electrode portion being spaced from said substrate by a thickness of said insulating layer which is greater than the thickness of said insulating layer which spaces said third electrode portion from said substrate for defining, in combination with the potential applied to said second electrode by said second means, a second region in said substrate adjacent said first region which is a potential barrier for said minority charge carriers in said substrate relative to said potential well in said first region, and for defining with said third electrode portion, in combination with the potential applied to said second electrode by said second means, a third region in said substrate adjacent said second region which is a potential well for said minority charge carriers in said substrate relative to said potential barrier in said second region; and
a third electrode in said insulating layer and extending generally parallel to said second electrode and electrically insulated from the latter by said insulating layer, said third electrode being connected with said second means for receiving a potential therefrom, said third electrode having a fourth electrode portion overlapping said third electrode portion and being spaced from said substrate by a thickness of said insulating layer which is larger than the thickness of said insulating layer which spaces said third electrode portion from said substrate, at least one of said second and third electrodes having a cutout portion cooperating with an adjacent portion of the other of said second and third electrodes to define an opening above said first region;
said first electrode further including a connecting portion extending from said side of said first electrode to which said second electrode portion of said second electrode is adjacent over said second electrode for connection to a first electrode portion of a first electrode of another of said photo-sensor elements, said insulating layer apacing said connecting portion of said first electrode from said second electrode.

3. A semiconductor image sensor composed of charge-coupled photo-sensor elements according to claim 2; in which at least said first electrode portion of said first electrode and said insulating layer are transparent for permitting the illuminating therethrough of said first region in said substrate to produce said minority charge carriers.

4. In a semiconductor image sensor composed of a plurality of charge-coupled photo-sensor elements, each of said photo-sensor elements comprising:
a substrate of one conductivity type;
an insulating layer on said substrate;
a first electrode on said insulating layer having first means for applying a potential to said first electrode, said first electrode having a first electrode portion which is spaced from said substrate by a thickness of said insulating layer for defining, in combination with the potential applied to said first electrode by said first means, a first region in said substrate which is a potential well for minority charge carriers in said substrate;
a second electrode in said insulating layer having second means for applying a potential to said second electrode, said second electrode having a second electrode portion adjacent one side of said first electrode and an adjacent third electrode portion remote from said first electrode, said second electrode portion being spaced from said substrate by a thickness of said insulating layer which is greater than the thickness of said insulating layer which spaces said third electrode portion from said substrate for defining, in combination with the poeential applied to said second electrode by said second means, a second region in said substrate adjacent said first region which is a potential barrier for said minority charge carriers in said substrate relative to said potential well in said first region, and for defining with said third electrode portion of said second electrode, in combination with the potential applied to said second electrode by said second means, a third region in said substrate adjacent said second region and which is a potential well for said minority charge carriers in said substrate relative to said potential barrier in said second region; and
a third electrode in said insulating layer and extending generally parallel to said second electrode and electrically insulated from the latter by said insulating layer, said third electrode being connected with said second means for receiving a potential therefrom, said third electrode having a fourth electrode portion overlapping said third electrode portion and being spaced from said substrate by a thickness of said insulating layer which is larger than the thickness of said insulating layer which spaces said third electrode portion from said substrate, at least one of said second and third electrodes having a cutout portion cooperating with an adjacent portion of the other of said second and third electrodes to define an opening above said first region;
said first electrode further including a fifth electrode portion along a side thereof which is different from said side of said first electrode adjacent to said second electrode and which is spaced from said substrate by a thickness of said insulating layer greater than the thickness of said insulating layer which spaces said first electrode portion of said first electrode from said substrate for defining, in combination with the potential applied to said first electrode by said first means, a fourth region which is a potential barrier for said minority charge carriers relative to said potential well in said first region of said substrate, said potential barrier in said fourth region being lower than said potential barrier in said second region of said substrate to control the number of said minority charge carriers which can be stored in said potential well in said first region of said substrate.

5. A semiconductor image sensor composed of a plurality of charge-coupled photo-sensor elements according to claim 4; in which said thickness of the insulating layer spacing said second electrode portion from said substrate is substantially equal to said thickness of the insulating layer spacing said fifth electrode portion from said substrate, and said thickness of the insulating layer spacing said first electrode portion from the substrate is substantially equal to said thickness of the insulating layer spacing said third electrode portion from the substrate; and in which said potential applied to said first electrode is larger than said potential applied to said second electrode.

* * * * *